US008045386B2

(12) United States Patent
Santin et al.

(10) Patent No.: US 8,045,386 B2
(45) Date of Patent: Oct. 25, 2011

(54) METHODS AND APPARATUS FOR PROGRAMMING A MEMORY CELL USING ONE OR MORE BLOCKING MEMORY CELLS

(75) Inventors: Giovanni Santin, Vazia (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/820,430

(22) Filed: Jun. 22, 2010

(65) Prior Publication Data
US 2010/0259992 A1 Oct. 14, 2010

Related U.S. Application Data (63) Continuation of application No. 11/973,733, filed on Oct. 10, 2007, now Pat. No. 7,742,338.

(30) Foreign Application Priority Data

Feb. 27, 2007 (IT) .............................. RM2007A0107

(51) Int. Cl.
*G11C 11/34* (2006.01)
(52) U.S. Cl. ......... 365/185.18; 365/185.17; 365/185.03; 365/185.24; 365/185.26; 365/185.29

(58) Field of Classification Search ............. 365/185.17, 365/185.18, 185.03, 185.24, 185.26, 185.29
See application file for complete search history.

(56) References Cited

U.S. PATENT DOCUMENTS

| | | | |
|---|---|---|---|
| 6,930,921 B2 * | 8/2005 | Matsunaga et al. | 365/185.18 |
| 7,161,833 B2 * | 1/2007 | Hemink | 365/185.18 |
| 7,525,841 B2 | 4/2009 | Aritome | |
| 7,561,469 B2 | 7/2009 | Aritome | |
| 2005/0105334 A1 | 5/2005 | Futasuyama | |
| 2005/0174852 A1 | 8/2005 | Hemink | |
| 2007/0236992 A1 | 10/2007 | Oowada | |

* cited by examiner

*Primary Examiner* — Tuan Nguyen
*Assistant Examiner* — Toan Le
(74) *Attorney, Agent, or Firm* — Leffert Jay & Polglaze, P.A.

(57) ABSTRACT

Methods and apparatus for programming a memory cell using one or more blocking memory cells facilitate mitigation of capacitive voltage coupling. The methods include applying a program voltage to a selected memory cell of a string of memory cells, and applying a cutoff voltage to a set of one or more memory cells of the string between the selected memory cell and a select gate. The methods further include applying a pass voltage to one or more other memory cells of the string between the selected memory cell and the select gate. Other methods further include applying other pass voltages, other cutoff voltages and/or intermediate voltages to still other memory cells of the string.

20 Claims, 10 Drawing Sheets

METHODS AND APPARATUS FOR PROGRAMMING A MEMORY CELL USING ONE OR MORE BLOCKING MEMORY CELLS

RELATED APPLICATIONS

This application is a continuation of U.S. patent application Ser. No. 11/973,733 now U.S. Pat. No. 7,742,338, filed Oct. 10, 2007 and titled "LOCAL SELF BOOST INHIBIT SCHEME WITH SHIELDED WORD LINE," which is commonly assigned and incorporated by reference in its entirety herein. This application further claims priority to Italian Patent Application Serial No. RM2007A000107, filed Feb. 27, 2007, entitled "LOCAL SELF BOOST INHIBIT SCHEME WITH SHIELDED WORD LINE," which is commonly assigned.

TECHNICAL FIELD OF THE INVENTION

The present embodiments relate generally to memory devices and in particular to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. For example, a tunnel oxide that is formed between the floating gate/node and the channel region. A control gate is located over the floating gate/node and is typically made of doped polysilicon or metal. The control gate is electrically separated from the floating gate/node by another dielectric layer. Thus, the floating gate or charge trapping layer/floating node is "floating" in dielectric so that it is insulated from both the channel and the control gate. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET.

An EEPROM or Flash NAND array architecture arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity. It is noted that other non-volatile memory array architectures exist, including, but not limited to AND arrays, OR arrays, and virtual ground arrays.

A problem in modern NAND architecture Flash memory devices is that, as device sizes and features are further reduced with improved processing, the separation between adjacent word lines in the array is reduced (also known as an increased word line or memory cell "array pitch"). This reduced word line separation can increase capacitive coupling between adjacent word lines, particularly when they have elevated voltages applied to them and/or high voltage differentials exist between adjacent word lines, such as during programming operations.

For the reasons stated above, and for other reasons stated below which will become apparent to those skilled in the art upon reading and understanding the present specification, there is a need in the art for alternative methods of programming and accessing NAND architecture Flash memory arrays.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include memory devices and arrays that reduce the effects of word line to word line capacitive voltage coupling by utilizing sets of pairs of adjacent word lines and applying the same voltage to each in array access operations. This allows each word line of the pair to, in effect, shield the other from word line to word line capacitive coupling and reduce its effect on the paired set of word lines over that seen with a single word line. It is also noted that more than two word lines can also be operated as a set for a given voltage change in a memory array to further reduce the effect of capacitive voltage coupling on the voltage change. Embodiments of the present invention are particularly advantageous in NAND architecture memory string programming operations, which combine closely spaced word lines with large word line voltage level changes, making them especially susceptible to capacitive voltage coupling effects.

It is noted, while various programming operation embodiments of the present invention are described in relation to local self boost and drain-side self boosting programming processes, that source-side self boost and virtual ground embodiments of the present invention are also possible and will be apparent to those skilled in the art with the benefit of the present invention. It is also noted that embodiments of the present invention include all non-volatile memory cell devices and memories that trap charge in an electrically isolated region (such as charge trapping/floating node memory cells) and are not limited to floating gate memory cell arrays or memory devices.

Figure 1:
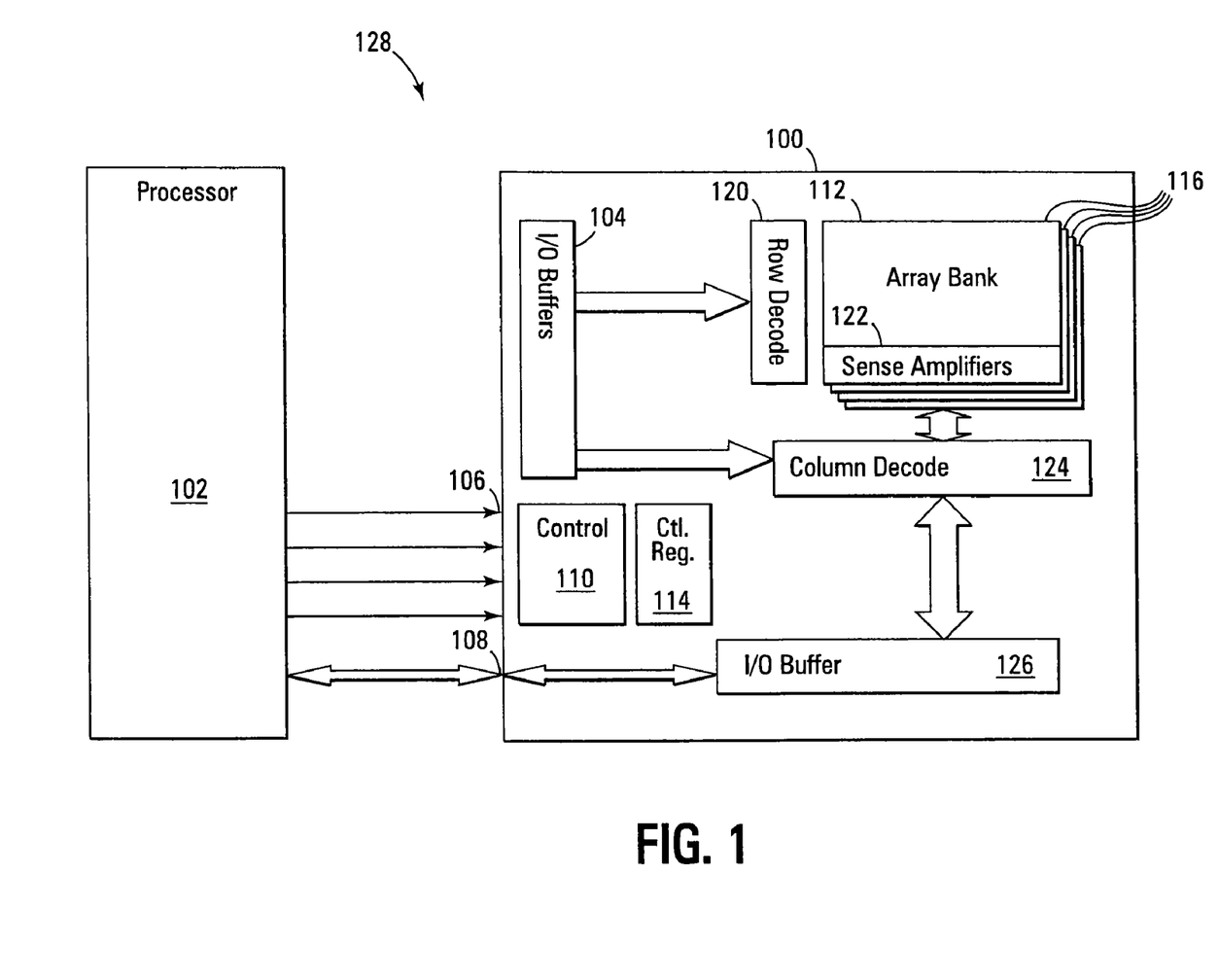
FIG. 1 is a simplified block diagram of a system containing a non-volatile memory device in accordance with an embodiment of the present invention.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). The column address of the access is also latched by the interface I/O buffer 104 and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NAND array architecture, the memory cells of the memory array are arranged in a matrix similar to conventional RAM or ROM, such that the gates of each memory cell of the array are coupled by rows to word lines (WL). However each memory cell is not directly coupled to a source line (SL) and a column bit line (BL), as would be the case in the NOR architecture style. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
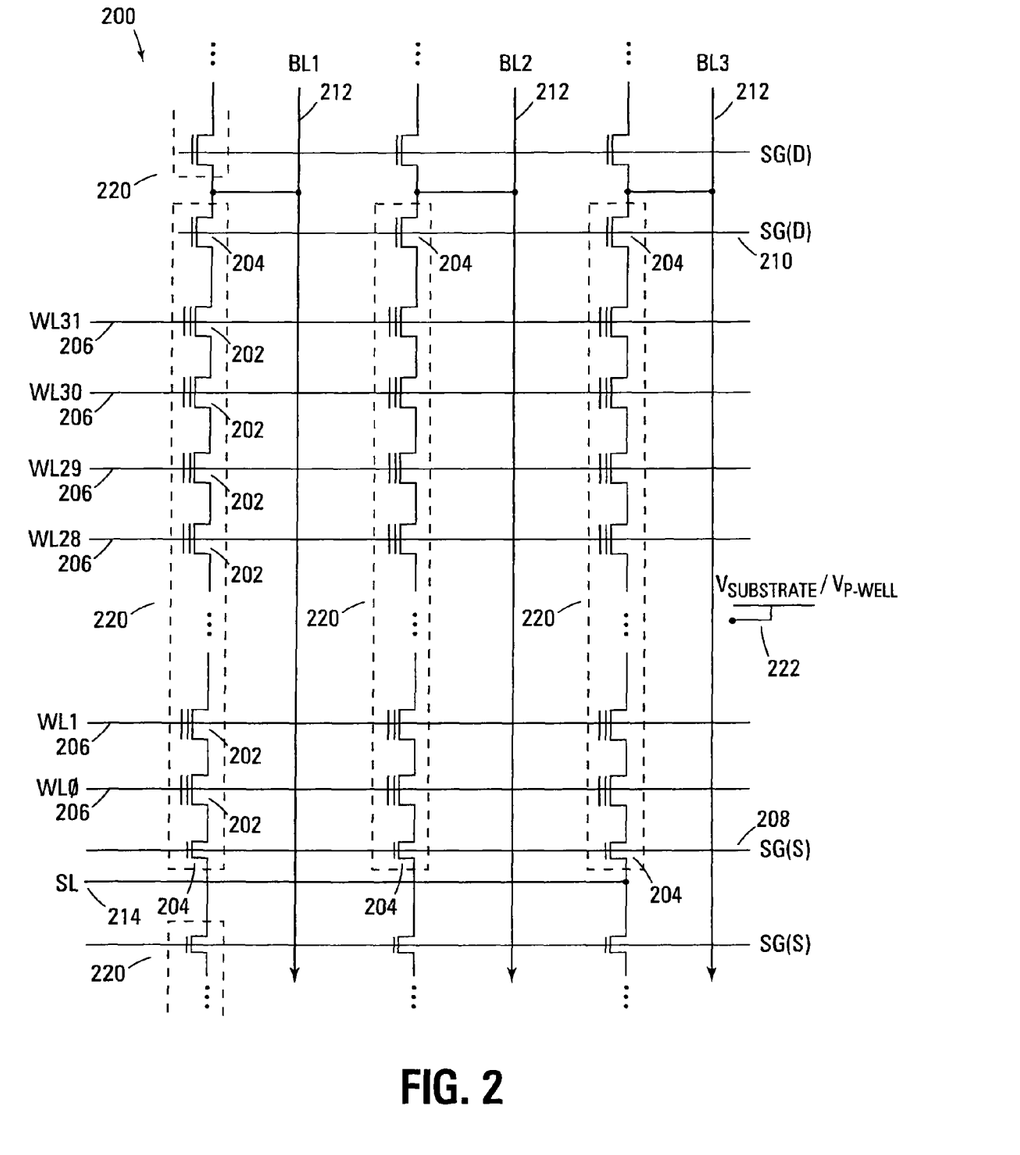
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, one or more NAND architecture memory strings 220 of the memory are shown formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage. It is noted that some erase operations also include program cycles. These erasure program cycles are typically used to preprogram the cells to a uniform programmed threshold voltage before erasure and to "heal" over-erased memory cells to a uniform erased state threshold voltage afterwards.

Figure 3:
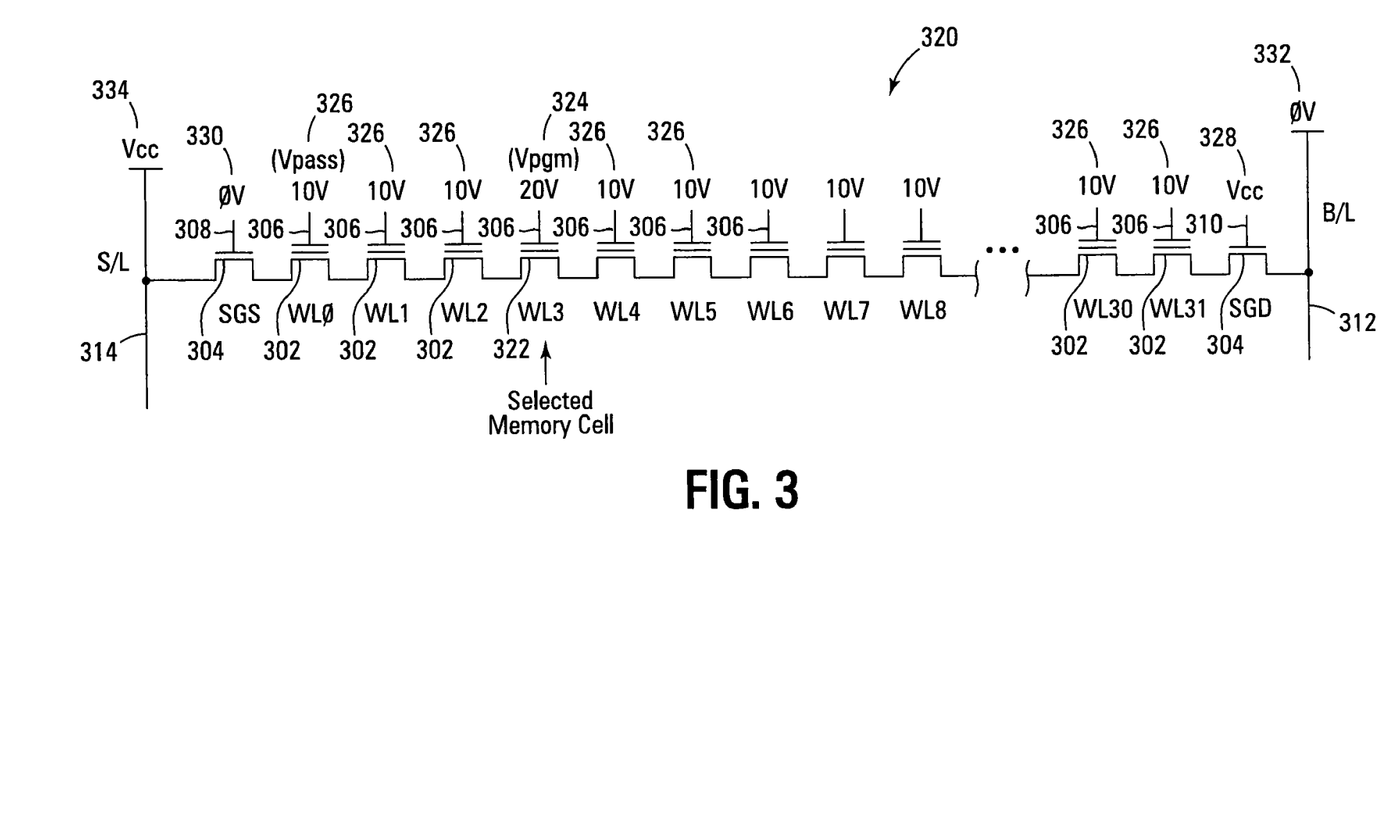
FIG. 3 shows a diagram detailing a typical non-split string program word line voltages, showing Vpgm and Vpass selection.

As detailed in FIG. 3, in one method of programming in NAND architecture Flash/EEPROM memory arrays, a programming voltage 324 is coupled to a word line 306 coupled to the gate of the selected memory cell 322 of a memory string 320. In addition, the word lines 306 that are coupled to the gates of the unselected memory cells 302 of the string 320 are also driven by a pass voltage (Vpass) 326 so as to operate them as pass transistors, generating a channel of carriers by capacitive coupling in the unselected memory cells 302 and allowing them to pass current in a manner that is relatively unrestricted by their stored data values. The memory string 320 is then coupled to a bit line 312 or source line 314 that has a program voltage placed upon it, through the generated channel of the string 320 and one or both of the select gates 304. This applies a field that across the selected memory cell 322 that causes carriers to tunnel from the channel to the floating gate or charge trapping layer, altering the threshold voltage level (Vt) of the selected memory cell 322 and storing the data value. If a program-inhibit voltage placed upon the coupled bit line 312 or source line 314, the applied field is not sufficient to tunnel carriers to the floating gate/node, no data value is programmed and the selected memory cell 322 remains in the erased state.

In the example programming operation detailed in FIG. 3, a program voltage (Vpgrm=20V) 324 is placed on the word line 306 coupled to the control gate of the selected memory cell 322. A channel is generated in the string 320, by the application of a pass voltage (Vpass=10V) 326 to the word lines 306 coupled to the control gates of the unselected memory cells 302 of the string 320. The select gate 304 coupling the memory string 320 to the source line 314 is turned off to isolate the string 320 from the source line 314 by the application of 0V 330 to the source select gate control line 308 and Vcc 334 to the source line 314. The memory string 320 is coupled to the bit line 312 through the drain select gate 304 by the application of Vcc 328 to the select gate drain control line 310 and the selected memory cell 322 is then programmed to a logical "0" state by the application of 0V 332 to the bit line 312. It is noted that the programming operation of FIG. 3 is for illustrative purposes and should not be taken as limiting.

After programming the selected memory cell(s) 322, a verify operation is then performed to confirm that the data was successfully programmed. If the programmed memory cell(s) 322 fail verification, the program and verify cycle is repeated until the data is successfully programmed or a selected number of iterations have passed and the programming operation is deemed to have failed.

In other alternative programming methods for NAND architecture memory cell strings, a split channel process is utilized. In a split channel programming process, a "blocking" memory cell is used to divide the channel of the string into two or more sections to isolate memory cells and/or string sections during programming with the aim of improving programming speed or efficiency, channel boost efficiency and/or minimizing program disturb of non-volatile memory cells of the string. These programming methods include, but are not limited to, local self boost, modified local self boost, drain-side self boost, modified drain-side self boost, source-side self boost and virtual ground programming processes. In these split channel programming processes, the blocking cells are typically placed adjacent the memory cell that has been selected for programming and have a ground potential or Vss is placed on their word lines to place them in cutoff. In the programming operation, a programming voltage is then coupled to the word line of the selected cell and Vpass is placed on the unselected word lines between the selected memory cell and the bit line to boost the channel under the cells. The selected memory cell is then variously coupled to the bit line or source line to apply a program or program-inhibit voltage to complete the programming operation.

For example, drain-side self boost (also known as erased area self boost) helps prevent the possibility of disturb in adjacent memory cells and adjacent strings by isolating the channel of the memory cell being programmed or inhibited from the remaining un-programmed memory cells of the string. In a drain-side self boost programming operation a memory cell/word line on the source line side of the memory cell selected for programming is tied to 0V or ground as a blocking cell to isolate the downstream cells of the memory string. A programming voltage is then coupled to the word line of the selected cell to couple up or "boost" a channel beneath the selected cell, and Vpass is placed on the unselected word lines between the selected memory cell and the bit line to boost the channel under the unselected cells. This couples selected memory cell to the bit line which has a program or program-inhibit voltage applied to it. Any other word lines on the source-side isolated from the main channel by the blocking cell have Vpass applied to them to generate a local channel and further assist in the prevention of program disturb. Source-side self boost is related technique to drain-side self boost. Source-side self boost boosts a channel under the selected memory cell and all memory cells on the source-side of the selected memory cell while applying the program or program-inhibit to the source line of the memory cell string. Local self boost further isolates the programmed cell of the string by grounding the directly adjacent word lines on both sides of the selected word line, and ties the remainder of the unselected word lines to Vpass. Modified local self boost, drain-side self boost, and source-side self boost processes also exist that utilize a secondary voltage, such as Vcc, on an intervening word line to step the voltage down from the programming word line voltage and the 0V or Vss of the blocking cell, reducing the overall voltage differential seen between any adjacent word line.

As stated above, problem in modern memory devices is that capacitive voltage coupling can affect the voltage levels of word lines and inject unwanted voltage noise as they are being utilized in array access operations. Capacitive coupling effects increase when the spacing between conductors is decreased and/or when the voltages driven on the conductors are increased. As the spacing between conductors decreases the coupling ratio between conductors is increased while the conductor resistance also generally increases, as conductor cross-section generally decreases, adversely affecting the RC time constant of the conductor and the ability of the driver to overcome any voltage noise). Therefore as device sizes and features are further reduced (also known as increasing the word line or memory cell "array pitch"), separation between adjacent word lines are decreased, and capacitive voltage coupling effects in modern memory device are thus becoming more of an issue. This capacitive coupling effect is particularly an issue in non-volatile memory devices which can also place elevated voltages on the adjacent word lines, such as during programming and erase operations.

Capacitive coupling has the effect of inducing voltage noise into the driven voltage levels of the word lines by resisting word line voltage changes and/or level shifting a word line voltage (due to a voltage change on one or more adjacent word lines). Capacitive coupling in particular can affect single word lines that are being driven to a different voltage than that of adjacent word lines (or single word lines being kept at an original voltage level while the adjacent word lines are changed) because of the coupling effects from multiple sides and the relative small amount of charge present on the single word line itself. This can allow for data disturb or corruption, lowered programming efficiency or failure, lowered block erase efficiency, overerasure, increase write fatigue, slower access speed, or other issues caused by the excessive capacitive coupling induced through the close array spacing and large voltage differentials.

Because they typically do not have as many intervening bit lines, source lines, control lines or other devices in the middle of each memory string to increase word line separation as other memory array architecture types, high density NAND architecture non-volatile memory devices can be especially affected by capacitive voltage coupling issues.

For example, in a NAND architecture split channel programming processes, the boosted channel may not boost efficiently or even lose the boosted charge if the blocking cells are not firmly in cutoff and can leak charge from section to section of the memory string channel. This can happen most prevalently in two situations. Firstly, where the adjacent/blocking cells are in a deeply erased state (i.e., overerased and so operate as depletion mode devices, having a negative or near zero volt threshold voltage). Or secondly, where voltage noise induced by the high word line programming voltages and capacitive coupling effects prevent the placement of the blocking cells firmly in cutoff (leaving them slightly "ON" or conducting and operating in a non-linear mode or even linear mode) during boosting.

As stated above, memory device embodiments of the present invention reduce the effects of word line to word line voltage coupling by utilizing sets of pairs of adjacent word lines and applying the same voltage to each in array access operations. This allows each word line of the pair to, in effect, shield the other from capacitive voltage coupling, reducing the effect on the paired set of word lines over that seen with a single word line. It is also noted that more than two word lines can also be operated as a set to further reduce the effect of capacitive voltage coupling on a given voltage change. Embodiments of the present invention are particularly advantageous in NAND architecture memory string programming operations to increase channel boosting efficiency, because the closely spaced word lines and large word line voltage level changes of NAND architecture devices make them especially susceptible to capacitive voltage coupling effects.

In NAND architecture non-volatile memory device and programming process embodiments of the present invention the various cells of strings of non-volatile memory cells are programmed utilizing a split channel process, such as local self boost, modified local self boost, drain-side self boost, modified drain-side self boost, source-side self boost and virtual ground programming processes, that utilize two or more "blocking" memory cells to divide the channel of the string and isolate various memory cells or string sections during programming. The blocking cell pairs are typically placed adjacent the memory cell selected for programming and have a ground potential or Vss is placed on their word lines to place them in cutoff. In the programming operation, a programming voltage is then coupled to the word line of the selected cell and Vpass is placed on the unselected word lines between the selected memory cell and the bit line to boost the channel under the selected and unselected cells. The selected memory cell is then variously coupled to the bit line for program or program-inhibit. The paired unselected blocking memory cells shield each other during the programming operation and application of the programming and Vpass voltages to reduce word line noise, preventing them from turning on and leaking charge off the boosted channel. This decreases channel leakage and increases boosting efficiency during programming.

Figure 4:
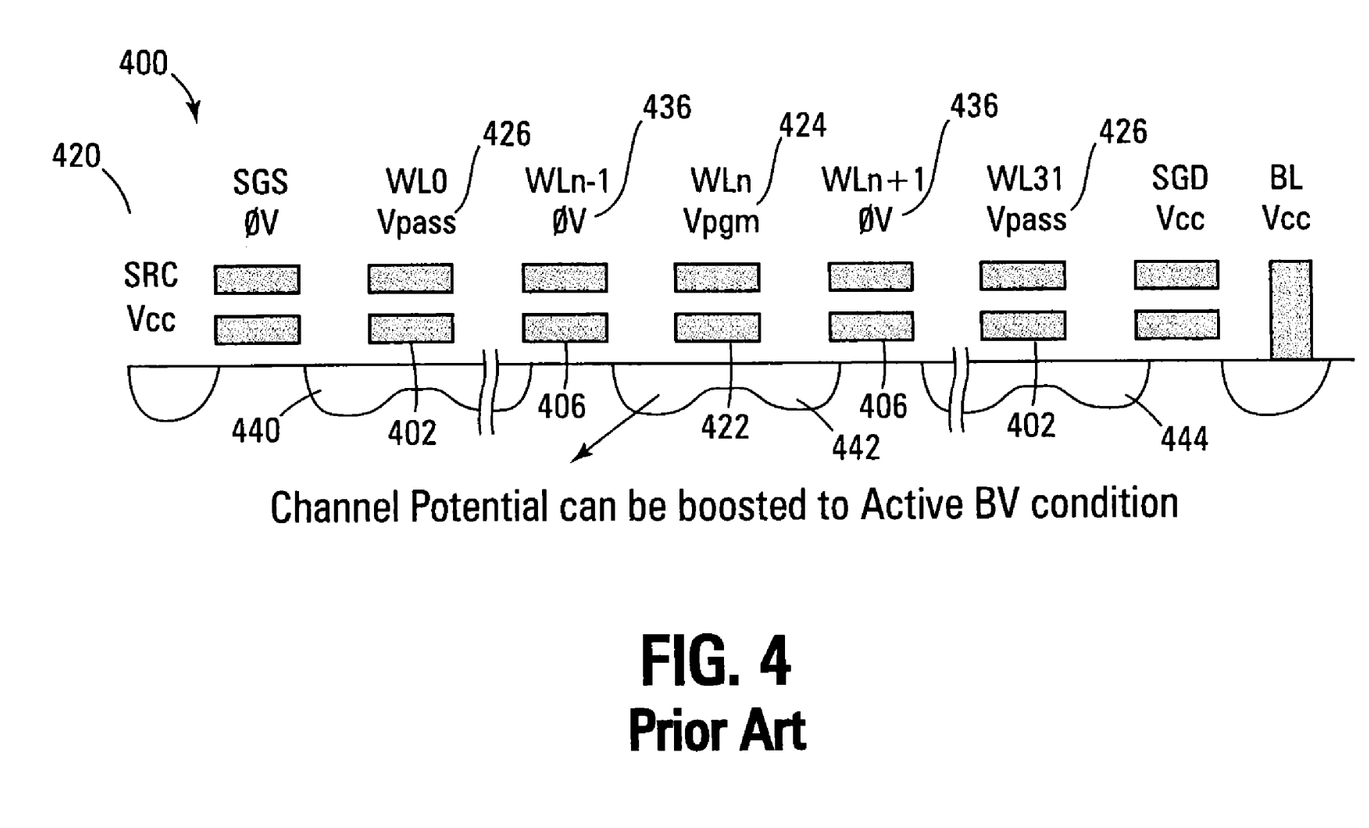
FIG. 4 details program word line voltages, showing Vpgm and Vpass selection, in a prior art local self boost programming operation.

FIG. 4 illustrates a prior art NAND architecture memory 400 in a local self boost programming operation with single blocking cells, showing the generated channel sections. In FIG. 4, a memory cell 422 coupled to WLn of the memory string 420 has been selected for programming and an elevated programming voltage 424 is applied to it. The directly adjacent memory cells coupled to WLn+1 and WLn−1 act as single blocking cells for the local self boost operation and have a cutoff voltage (such as, ground or 0V) 436 applied to their gates. A pass voltage (Vpass) 426 is coupled to the gates of the remaining unselected memory cells 402 of the string 420 that are outside of the blocking cells. This boosts a channel of carriers by capacitive coupling underneath the memory cells 402, 422 which is divided into three sections (a source-side boosted channel section 440, a drain-side boosted channel section 444 and the programmed cell's boosted channel 442), each with differing boosted channel voltages, isolated by the cutoff blocking cells 406. As stated above, if the blocking cells were deeply erased (overerased) or have a word line voltage induced on their control gates by capacitive coupling to Vpass 426 or Vpgm 424 of the adjacent word lines, the boosted channel may not boost efficiently or even lose the boosted charge because the blocking cells will not be firmly in cutoff and leak charge from section to section of the memory string channel.

FIGS. 5A-5C and 6A-6B illustrate a typical NAND architecture memory arrays and string programming operations of embodiments of the present invention that utilize paired word lines to shield them from capacitive coupling effects, reducing charge leakage and increasing channel boosting efficiency. It is noted, while the NAND programming operation embodiments of the present invention are described in relation to local self boost and drain-side self boosting programming processes, that source-side self boost and virtual ground embodiments of the present invention are also possible and will be apparent to those skilled in the art with the benefit of the present invention. It is therefore also noted that the NAND programming operations described in FIGS. 5A-5C and 6A-6B are for illustrative purposes and should not be taken as limiting.

Figure 5A:
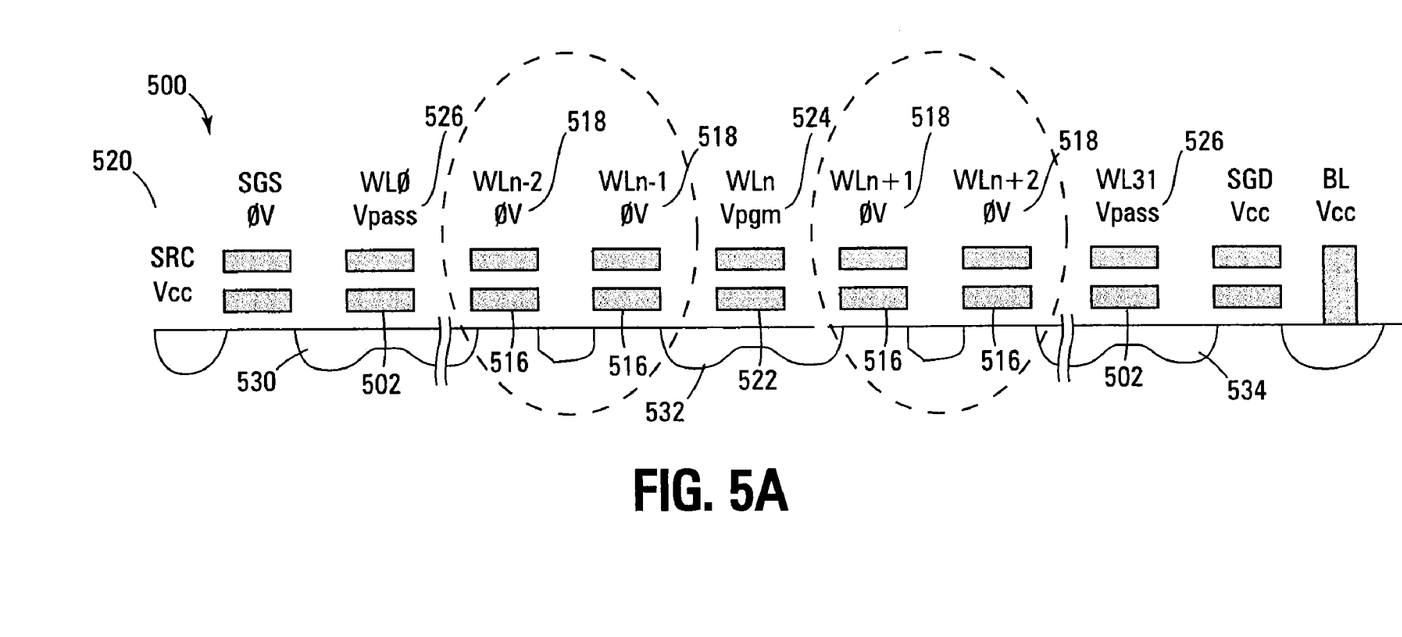
FIGS. 5A-5C show diagrams detailing program word line voltages in local self boost and modified local self boost programming operations in accordance with embodiments of the present invention.
Figure 5B:
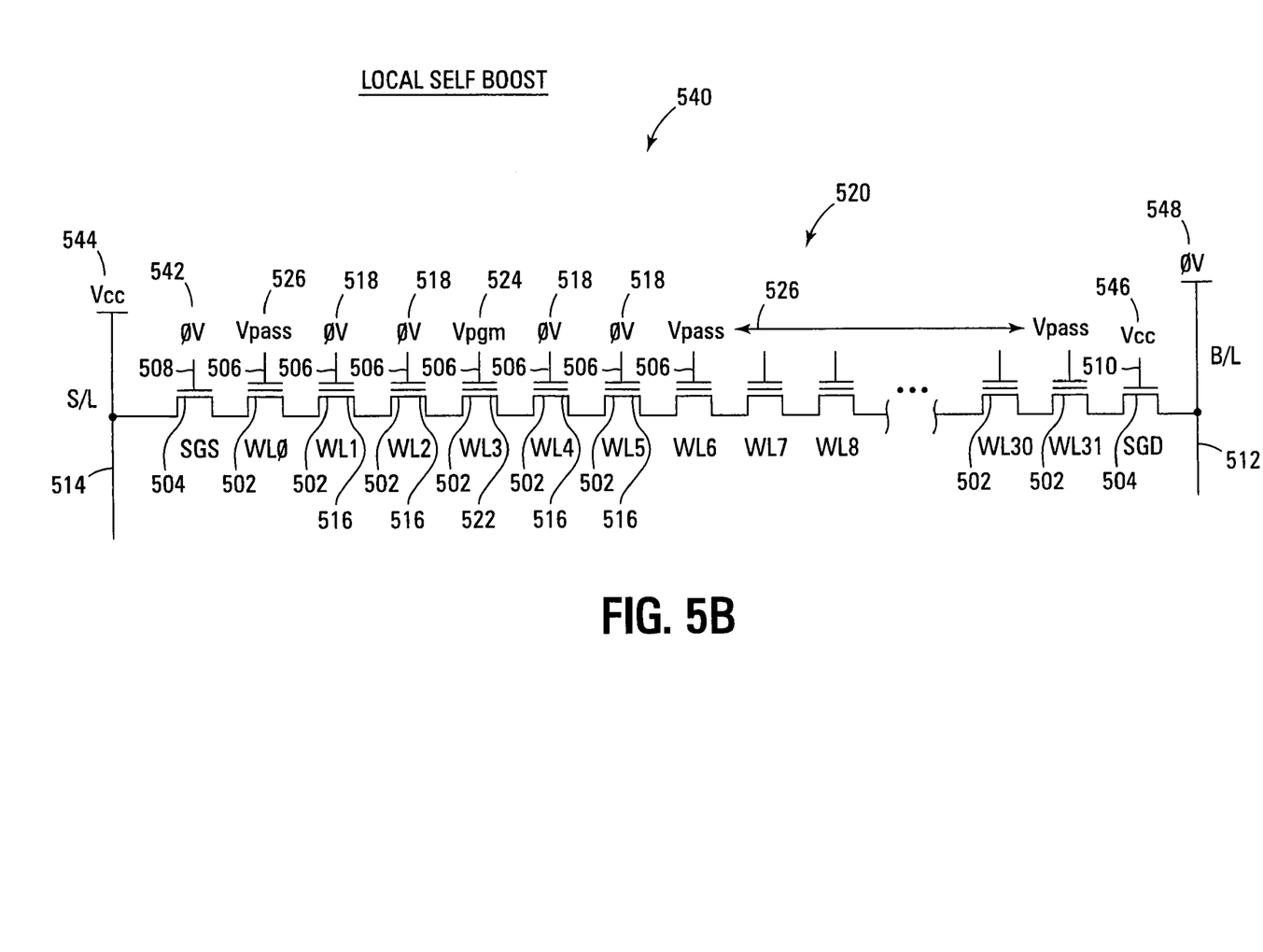

FIGS. 5A and 5B illustrate a NAND architecture memory 500, 540 of an embodiment of the present invention that utilizes pairs of blocking cells 516 to shield capacitive coupling effects during a local self boost programming operation and showing the generated channel sections 530, 532, 534. In FIG. 5, a memory cell 522 coupled to WLn of the memory string 520 has been selected for programming and an elevated programming voltage 524 is applied to it. The directly adjacent pairs of memory cells coupled to WLn+1, WLn+2 and WLn−1, WLn−2 have been selected to act as paired blocking cells 516 for the local self boost operation and have a cutoff voltage (such as, ground or 0V) 518 applied to the control gates of each pair. A pass voltage (Vpass) 526 is coupled to the gates of the remaining unselected memory cells 502 of the string 520 that are outside of the blocking cells 516. This boosts a channel of carriers by capacitive coupling underneath the memory cells 502, 522 of the string 520 which is divided into three sections (a source-side boosted channel section 530, a drain-side boosted channel section 534 and the programmed cell's boosted channel 532), each with differing boosted channel voltages isolated by the cutoff blocking cells 516.

As noted above, the paired blocking cells 516 embodiments of the present invention allow their word lines to help shield each other from adverse capacitive coupling effects, reducing any word line voltage induced on their control gates from capacitive coupling to Vpass 526 or Vpgm 524 of the adjacent word lines. This allows the channel to boost efficiently and prevents loss of the boosted charge because the blocking cells 516 will be firmly in cutoff and charge will not leak from section to section of the memory string channel 530, 532, 534. In addition, the issue with deeply erased (overerased) cells is lessened because the probability of having both blocking cells 516 in a deeply erased or overerased state is small. Thus even if one cell of the blocking pair 516 is in a deeply erased state, the probability is high that other cell will not be and thus at least one cell of the pair will be "OFF" and placed in cutoff. This allows in various embodiments of the present invention a less rigorous erase verification and/or healing process and acceptance of a wider range/logic window for the erased state.

In FIG. 5B, a memory cell 522 coupled to WL3 506 of the memory string 520 has been selected for programming and an elevated programming voltage 524 is applied to it. The memory cells coupled to adjacent word lines, WL1/WL2 and WL4/WL5, act as the blocking cell pairs for the local self boost and have a cutoff voltage (such as, ground or 0V) 518 applied to their gates. In addition, a pass voltage (Vpass) 526 is applied to WL0 during the programming operation to boost a voltage in the channel seen at the source of the blocking cell of WL0 and enhance cutoff in it and in the source select gate 504 coupled to the source line 514. The word lines 506 that are coupled to the gates of the unselected memory cells 502 of the string 520 towards the bit line 512 are also driven by the pass voltage (Vpass) 526 so as to operate them as pass transistors, generating a channel of carriers by capacitive coupling in the unselected memory cells 502 and allowing them to pass current in a manner that is relatively unrestricted by their threshold voltage values. Once the channels of carriers are boosted in the memory string 520, the blocking cells 516 on the drain-side of the selected memory cell 522 are turned on by driving their gates with Vpass to couple the selected memory cell 522 to a bit line 512 that has a program voltage placed upon it, through the generated drain-side channel of the string 520 and drain select gate 504. This applies a field across the selected memory cell 522 that causes carriers to tunnel from the channel to the floating gate or charge trapping layer, altering the threshold voltage level (Vt) of the selected memory cell 522 and storing the data value. If a program-inhibit voltage is placed upon the coupled bit line 512, the applied field is not sufficient to tunnel carriers to the floating gate/node, no data value is programmed and the selected memory cell 522 remains in the erased state.

For example, in the programming operation detailed in FIG. 5B, a program voltage (Vpgm=20V) 524 is placed on the word line 506 coupled to the control gate of the selected memory cell of WL3 522. A pass voltage (Vpass=9V) 526 is applied to the word lines 506 coupled to the control gates of the drain-side unselected memory cells 502 of the string 520. The memory cells 502 coupled to WL1/WL2 and WL4/WL5 act as the blocking cell pairs 516 have a cutoff voltage (such as 0V, Vss, or ground) 518 applied to their gate to place them in cutoff and a pass voltage (Vpass=9V) 526 is applied to WL0 to boost the voltage at the source of the blocking cell 516 of WL1 and enhance cutoff in it and the select gate 504 coupled to the source line 514. The select gate 504 coupling the memory string 520 to the source line 514 is turned off to isolate the string 520 from the source line 514 by the application of 0V 542 to the source select gate control line 508 and Vcc 544 to the source line 514. The memory string 520 is then coupled to the bit line 512 through the drain select gate 504 by the application of Vcc 546 to the select gate drain control line 510 and the selected memory cell 522 is then programmed to a logical "0" from the erased or logical "1" state by the application of 0V 548 to the bit line 512.

Figure 5C:
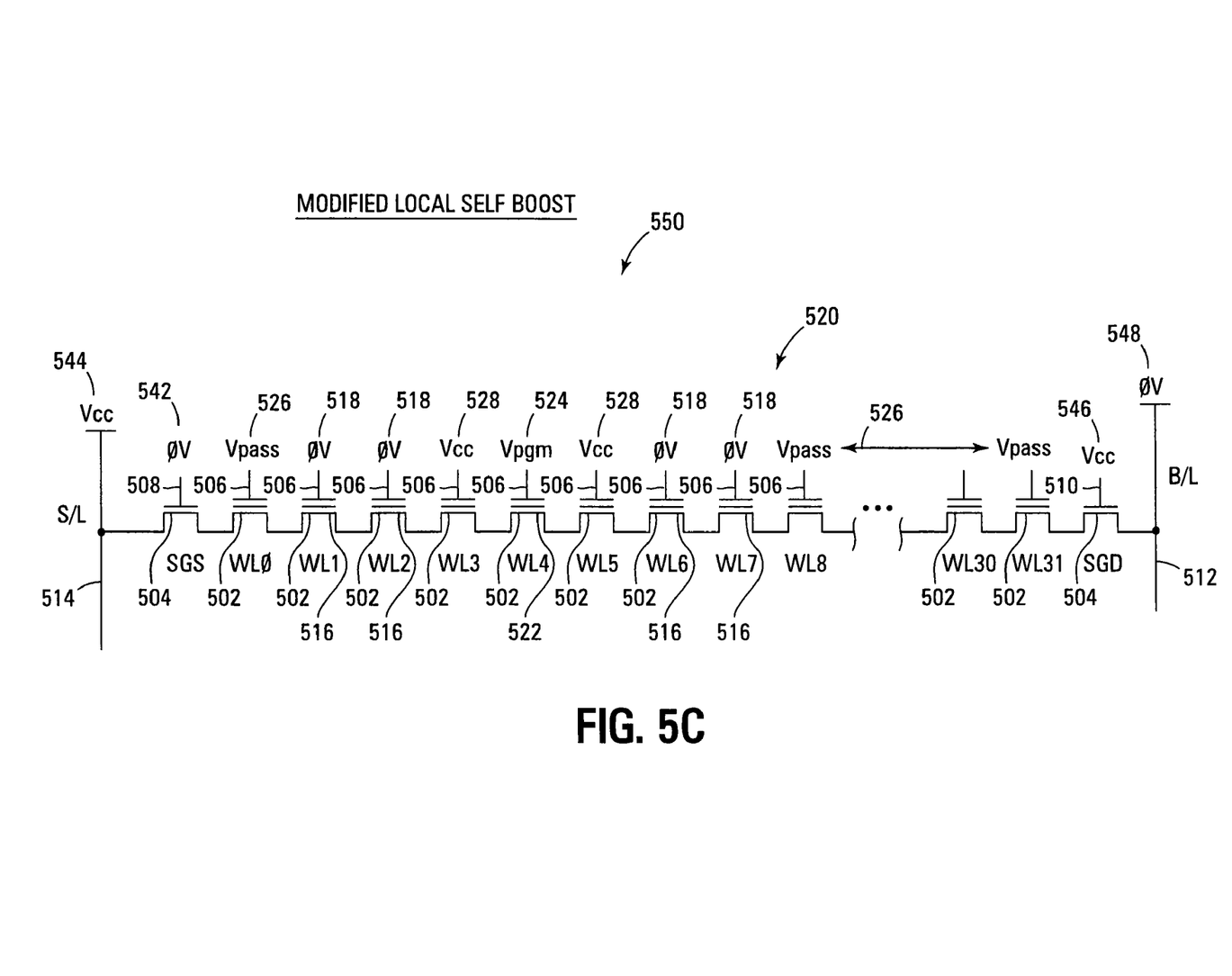

FIG. 5C illustrates a NAND architecture memory 550 embodiment of the present invention that utilizes pairs of blocking cells 516 to shield capacitive coupling effects during a modified local self boost programming operation. In FIG. 5C, the memory cell 522 coupled to the WL4 506 of the memory string 520 has been selected for programming and an elevated programming voltage 524 is applied to it. Word lines/memory cells 502 coupled to WL3 and WL5, directly adjacent the memory cell/WL4 selected for programming 522, are coupled to an intermediate voltage 528, such as Vcc or Vdd, to decrease the maximum word line to word line voltage differential of the programming operation. The memory cells 502 coupled to WL1/WL2 and WL6/WL7 act as the blocking cell pairs for the modified local self boost and have a ground or 0V potential 518 applied to their gates. In addition, a pass voltage (Vpass) 526 is applied to WL0 during the programming operation to boost the voltage at the source of the blocking cell of WL1 and enhance cutoff in the blocking cell and the select gate 504 coupled to the source line 514. The word lines 506 that are coupled to the gates of the unselected memory cells 502 of the string 520 towards the bit line 512 are driven by a pass voltage (Vpass) 526 so as to operate them as pass transistors, generating a channel of carriers in the unselected memory cells 502. Once the carrier channels are generated, the blocking cells 516 on the drain-side of the selected memory cell 522 are coupled to Vpass, coupling the memory string 520 to a bit line 512 that has a program or program-inhibit voltage placed upon it, through the generated drain-side channel of the string 520 and select gate 504.

It is noted that the selected word lines, programming operation and voltage levels of FIGS. 5A-5C are for illustrative purposes and should not be taken as limiting.

Figure 6A:
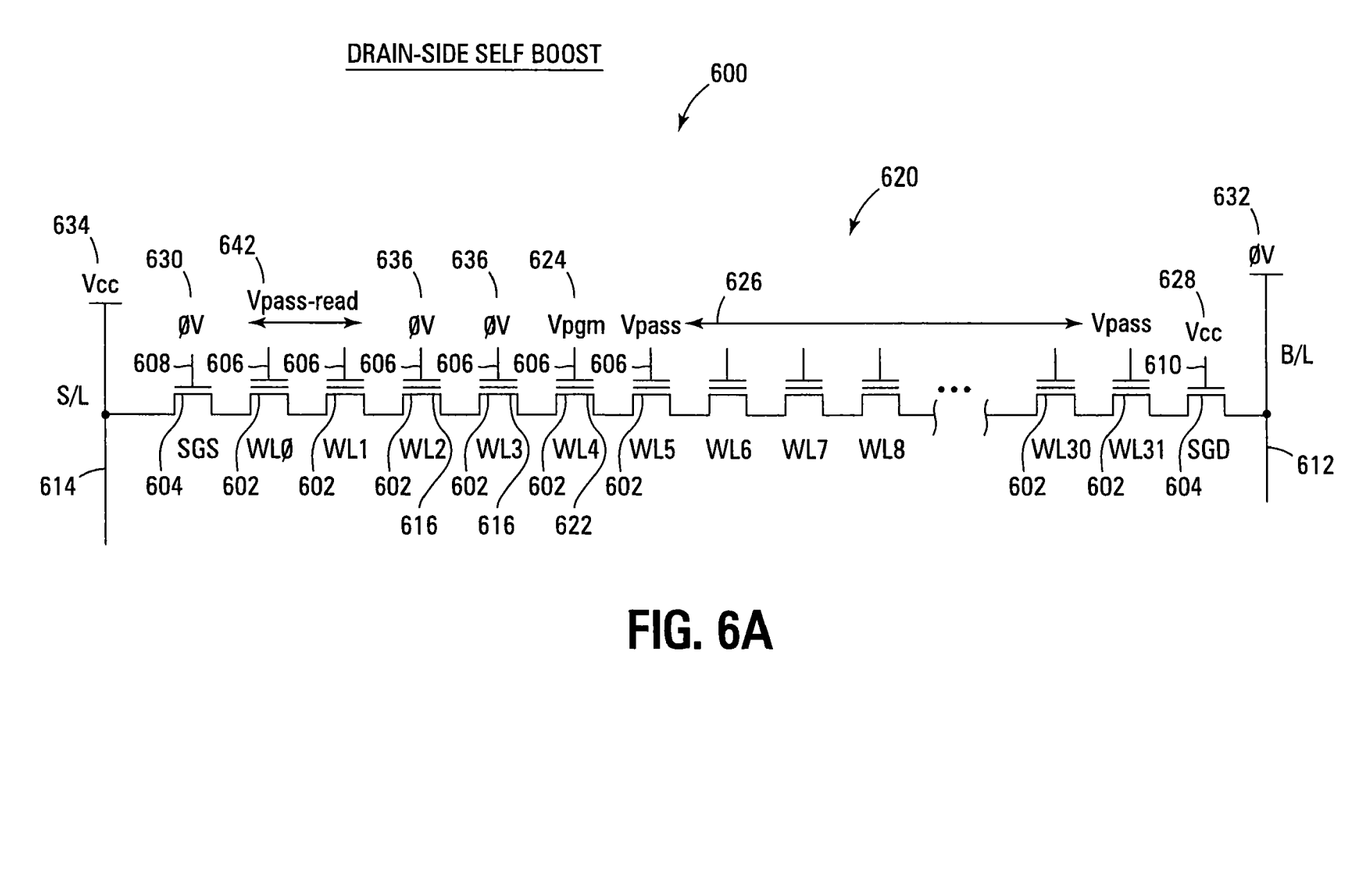
FIGS. 6A-6B show diagrams detailing program word line voltages in drain-side self boost and modified drain-side self boost programming operations in accordance with embodiments of the present invention.

FIG. 6A illustrates a NAND architecture memory 600 embodiment of the present invention that utilizes a pair of blocking cells 616 to shield capacitive coupling effects during a drain-side self boost programming operation. In FIG. 6A, a memory cell 622 coupled to WL4 606 of the memory string 620 has been selected for programming and an elevated programming voltage 624 is applied to it. The memory cells coupled to WL2 and WL3, on the source-side of the selected cell, act as the blocking cell pair 616 for the drain-side self boost and have a cutoff voltage (such as, ground or 0V) 636 applied to their gates. In addition, a read pass voltage (Vpass-read, the typical read pass voltage for the memory device) 642 is applied to WL0 and WL1 during the programming operation to boost the voltage at the source of the blocking cell of WL2 and enhance cutoff in it and in the source select gate 604 coupled to the source line 614. It is noted that in another embodiment, a program pass voltage (Vpass) is utilized instead of the read pass voltage (Vpass-read,) on WL0 and WL1 (the source-side unselected memory cells 602). The word lines 606 that are coupled to the gates of the unselected memory cells 602 of the string 620 towards the bit line 612 (the drain-side of the selected memory cell 622) are driven by a program pass voltage (Vpass) 626 so as to operate them as pass transistors, generating a channel of carriers by capacitive coupling in the unselected memory cells 602 and allowing them to pass current in a manner that is relatively unrestricted by their threshold voltage values. The memory string 620 is then coupled to a bit line 612 that has a program voltage placed upon it, through the generated drain-side channel of the string 620 and drain select gate 604. This applies a field across the selected memory cell 622 that causes carriers to tunnel from the channel to the floating gate or charge trapping layer, altering the threshold voltage level (Vt) of the selected memory cell 622 and storing the data value. If a program-inhibit voltage is placed upon the coupled bit line 612, the applied field is not sufficient to tunnel carriers to the floating gate/node, no data value is programmed and the selected memory cell 622 remains in the erased state.

For example, in the programming operation detailed in FIG. 6A, a program voltage (Vpgm=20V) 624 is placed on the word line 606 coupled to the control gate of the selected memory cell of WL4 622. A channel is generated in the string 620, by the application of a pass voltage (Vpass=9V) 626 to the word lines 606 coupled to the control gates of the drain-side unselected memory cells 602 of the string 620. The blocking memory cells coupled to WL2 and WL3 have a cutoff voltage (such as 0V, Vss, or ground) 636 applied to their gates to place them in cutoff and read pass voltage (Vpass-read=6V-8V) 638 is applied to WL0 and WL1 (the source-side unselected cells) to boost the voltage at the source of the blocking cells WL2 and W3 and enhance cutoff in it and the select gate 604 coupled to the source line 614. The select gate 604 coupling the memory string 620 to the source line 614 is turned off to isolate the string 620 from the source line 614 by the application of 0V 630 to the source select gate control line 608 and Vcc 634 to the source line 614. The memory string 620 is coupled to the bit line 612 through the drain select gate 604 by the application of Vcc 628 to the select gate drain control line 610 and the selected memory cell 622 is then programmed to a logical "0" state by the application of 0V 632 to the bit line 612.

Figure 6B:
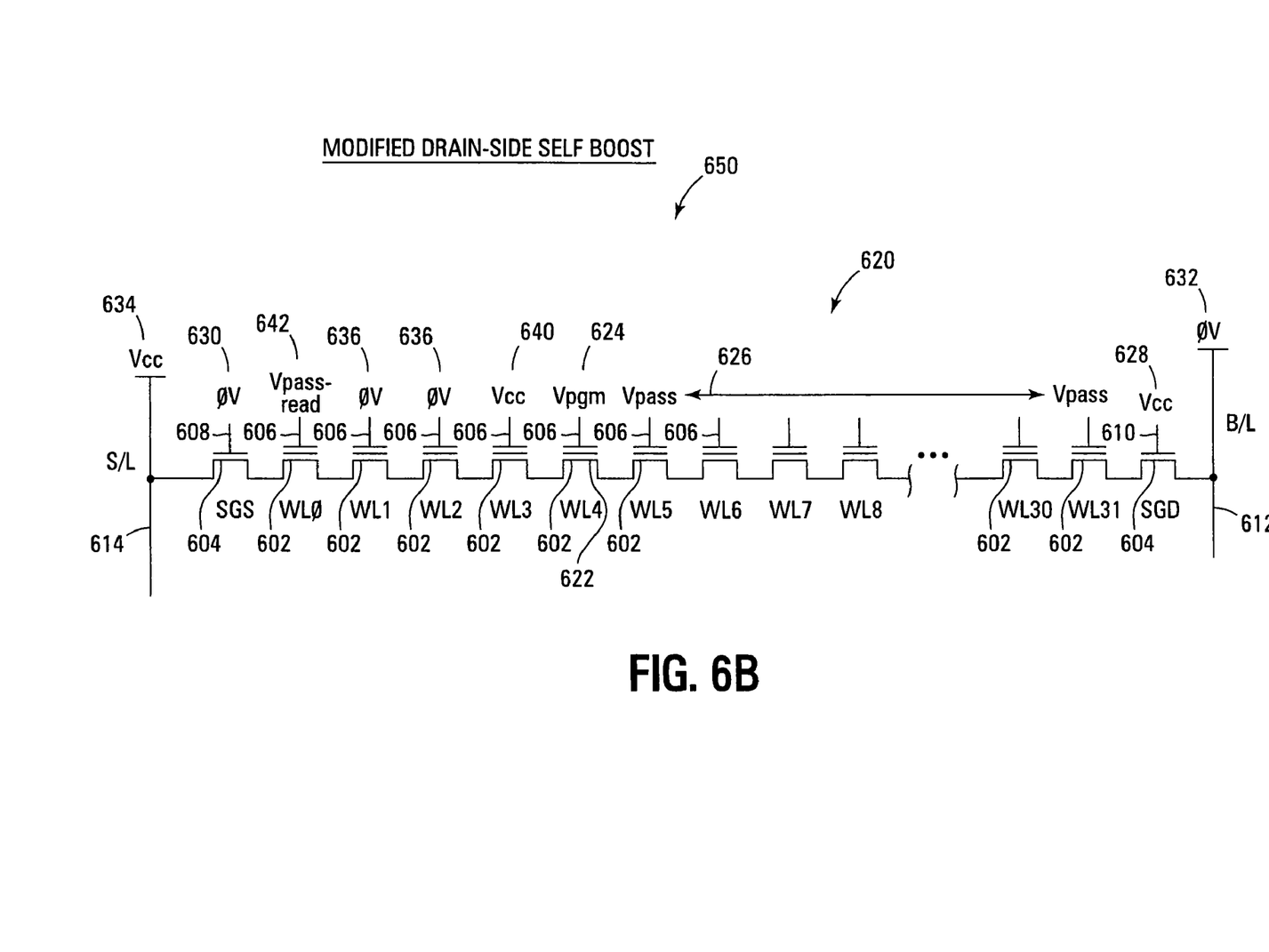

FIG. 6B illustrates a NAND architecture memory 650 embodiment of the present invention that utilizes a pair of blocking cells 616 to shield capacitive coupling effects during a modified drain-side self boost programming operation. In FIG. 6B, the memory cell 622 coupled to the WL of the memory string 620 has been selected for programming and an elevated programming voltage 624 is applied to it. Word line/memory cell 602 coupled to WL3, directly adjacent the memory cell/WL4 selected for programming 622, is coupled to an intermediate voltage 640, such as Vcc or Vdd, to decrease the maximum word line to word line voltage differential of the programming operation. The memory cells coupled to WL1 and WL2 act the blocking cell pair for the modified drain-side self boost and has a ground or 0V potential 636 applied to their gates. In addition, a read pass voltage (Vpass-read) 642 is applied to WL0 during the programming operation to boost the voltage at the source of the blocking cell of WL1 and enhance cutoff in the blocking cell and the select gate 604 coupled to the source line 614. The word lines 606 that are coupled to the gates of the unselected memory cells 602 of the string 620 towards the bit line 612 are driven by a pass voltage (Vpass) 626 so as to operate them as pass transistors, generating a channel of carriers in the unselected memory cells 602. The memory string 620 is then coupled to a bit line 612 that has a program or program-inhibit voltage placed upon it, through the generated drain-side channel of the string 620 and select gate 604.

It is again noted that the programming operation and voltage levels of FIGS. 6A-6B are for illustrative purposes and should not be taken as limiting. It is also noted that in source-side self boost and modified source-side self boost embodiments of the present invention, the voltages applied to the memory string 620 are the mirror opposite of drain-side self boost, with the blocking cell pair 616 on the drain-side of the selected memory cell and the selected memory cell being coupled to the source line 614 for a program or program-inhibit voltage through a channel of carriers generated on the source-side unselected memory cells 602. It is further noted that virtual ground embodiments of the present invention allow the roles of the source line 614 and bit line 612 to be interchanged, reversing carrier flow in the string, reversing the application of the selected form of drain-side self boost, source-side self boost, or local self boost programming operation being utilized on the string. This, in particular allows for non-conductive floating gates/nodes to be utilized to store multiple bits of data in each memory cell of the string through the storage of charge over each source/drain region of the cell.

It is noted that other voltages and number of blocking cells may be used in modified and unmodified drain-side self boost, source-side self boost, local self boost, and virtual ground programming operations are possible and will be apparent to those skilled in the art with the benefit of the present disclosure.

Figure 7:
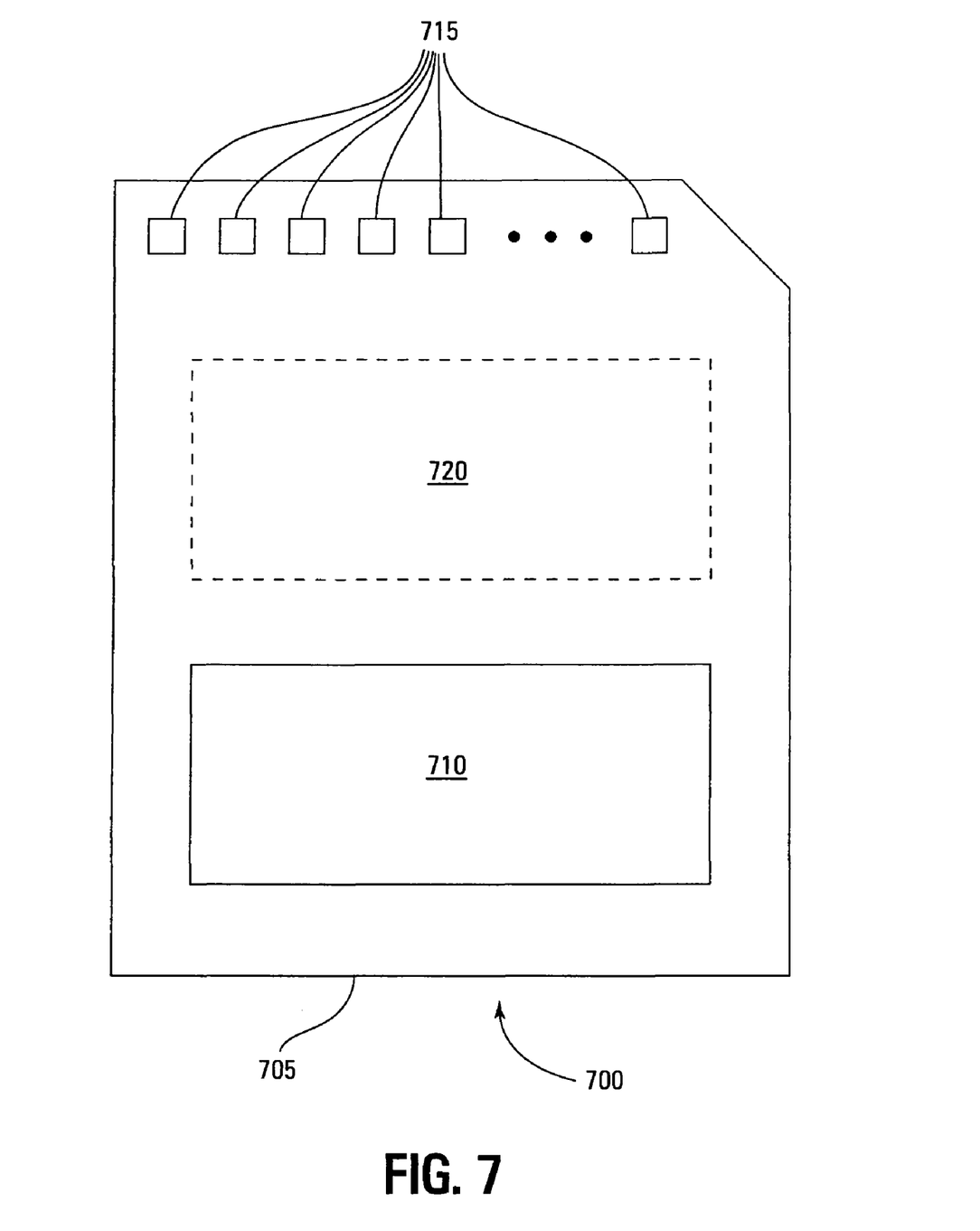
FIG. 7 is a simplified block diagram of a memory module in accordance with an embodiment of the present invention.

FIG. 7 is an illustration of a memory module 700 in accordance with an embodiment of the present invention. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory including circuits of or adapted to perform elements of methods of the present invention. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

It is noted that other programming operations and voltage levels for non-volatile memory device and array embodiments of the present invention are possible and will be apparent for those skilled in the art with the benefit of this disclosure.

CONCLUSION

A NAND architecture non-volatile memory device and programming process has been described that reduce the effects of word line to word line voltage coupling by utilizing sets of two or more adjacent word lines and applying the same voltage to each in array access operations. This allows each word line of the set or pair to shield the other from word line to word line capacitive voltage coupling. In particular, NAND architecture memory string programming embodiments of the present invention that program the various cells of strings of non-volatile memory cells utilizing modified and unmodified drain-side self boost, source-side self boost, local self boost, and virtual ground programming processes that utilizes two or more "blocking" memory cells on either the source line side and drain line side of a memory cell selected for programming. The paired unselected blocking memory cells adjacent to the selected memory cell shield each other during the programming operation to reduce word line noise and prevent them from turning on and leaking charge off the boosted channel of the selected memory cell, decreasing channel leakage and increasing boosting efficiency during programming.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a memory cell, the method comprising:
    applying a program voltage to a selected memory cell of a string of memory cells;
    applying a cutoff voltage to a first set of one or more memory cells of the string between the selected memory cell and a select gate;
    applying a first pass voltage to a second set of one or more memory cells of the string between the first set of one or more memory cells and the select gate; and
    applying a second pass voltage to a third set of one or more remaining memory cells of the string, where the first pass voltage is between the second pass voltage and a reference voltage.

2. The method of claim 1, wherein the memory cells of the first set of one or more memory cells are directly adjacent to each other.

3. The method of claim 1, wherein the reference voltage comprises a ground potential.

4. The method of claim 1, wherein applying a cutoff voltage to a first set of one or more memory cells of the string between the selected memory cell and a select gate comprises applying a cutoff voltage to a first set of two or more memory cells of the string between the selected memory cell and the select gate.

5. The method of claim 1, wherein applying a second pass voltage to a third set of one or more remaining memory cells of the string comprises applying the second pass voltage to operate each memory cell of the third set of one or more remaining memory cells as pass transistors.

6. The method of claim 5, wherein applying a first pass voltage to a second set of one or more memory cells of the string between the first set of one or more memory cells and the select gate comprises applying a read pass voltage to the second set of one or more memory cells.

7. The method of claim 1, further comprising:
    applying an intermediate voltage to a particular memory cell of the string;
    wherein the intermediate voltage is between the program voltage and the cutoff voltage; and
    wherein the particular memory cell is between the selected memory cell and a memory cell of the first set of one or more memory cells.

8. The method of claim 7, wherein applying an intermediate voltage to a particular memory cell of the string comprises applying a supply potential to the particular memory cell of the string.

9. The method of claim 1, wherein the select gate comprises a select gate source configured to control coupling of the string to a source line.

10. A method of programming a memory cell, the method comprising:
    applying a program voltage to a selected memory cell of a string of memory cells;
    applying a cutoff voltage to a first set of one or more memory cells of the string between the selected memory cell and a select gate;
    applying a first pass voltage to a second set of one or more memory cells of the string between the first set of one or more memory cells and the select gate; and
    applying a second pass voltage to one or more remaining memory cells of the string,
    wherein the first pass voltage is between the second pass voltage and a reference potential.

11. A method of programming a memory cell, the method comprising:
    applying a program voltage to a selected memory cell of a string of memory cells;
    applying a cutoff voltage to one or more memory cells of the string between the selected memory cell and a first select gate;
    applying a cutoff voltage to one or more memory cells of the string between the selected memory cell and a second select gate;
    applying a pass voltage to one or more remaining memory cells of the string.

12. The method of claim 11, wherein applying a cutoff voltage to one or more memory cells of the string between the selected memory cell and a first select gate comprises applying a cutoff voltage to two or more memory cells of the string between the selected memory cell and the first select gate.

13. The method of claim 12, wherein applying a cutoff voltage to one or more memory cells of the string between the selected memory cell and a second select gate comprises applying a cutoff voltage to two or more memory cells of the string between the selected memory cell and the second select gate.

14. The method of claim 11, further comprising:
    applying an intermediate voltage to a first particular memory cell of the string;
    applying an intermediate voltage to a second particular memory cell of the string;
    wherein the intermediate voltage applied to the first particular memory cell is between the program voltage and the cutoff voltage applied to the one or more memory cells of the string between the selected memory cell and the first select gate;
    wherein the intermediate voltage applied to the second particular memory cell is between the program voltage and the cutoff voltage applied to the one or more memory cells of the string between the selected memory cell and the second select gate;
    wherein the first particular memory cell is between the selected memory cell and a memory cell of the one or more memory cells of the string between the selected memory cell and the first select gate; and
    wherein the second particular memory cell is between the selected memory cell and a memory cell of the one or more memory cells of the string between the selected memory cell and the second select gate.

15. The method of claim 11, wherein the first select gate comprises a select gate source configured to control coupling of the string to a source line and the second select gate comprises a select gate drain configured to control coupling of the string to a bit line.

16. A memory device comprising:
    a string of memory cells; and
    control circuitry, wherein the control circuitry is configured to:
        apply a program voltage to a selected memory cell of the string of memory cells;
        apply a cutoff voltage to a first set of one or more memory cells of the string between the selected memory cell and a select gate;
        apply a first pass voltage to a second set of one or more memory cells of the string between the first set of one or more memory cells and the select gate; and apply a second pass voltage to a third set of one or more remaining memory cells of the string, where the first pass voltage is between the second pass voltage and a reference voltage.

17. A memory device comprising:
a string of memory cells; and
control circuitry, wherein the control circuitry is configured to:
   apply a program voltage to a selected memory cell of the string of memory cells;
   apply a cutoff voltage to a first set of one or more memory cells of the string between the selected memory cell and a select gate;
   apply a first pass voltage to a second set of one or more memory cells of the string between the first set of one or more memory cells and the select gate; and
   apply a second pass voltage to one or more remaining memory cells of the string,
   wherein the first pass voltage is between the second pass voltage and a reference potential.

18. A memory device comprising:
a string of memory cells; and
control circuitry, wherein the control circuitry is configured to:
   apply a program voltage to a selected memory cell of the string of memory cells;
   apply a cutoff voltage to one or more memory cells of the string between the selected memory cell and a first select gate;
   apply a cutoff voltage to one or more memory cells of the string between the selected memory cell and a second select gate; and
   apply a pass voltage to one or more remaining memory cells of the string.

19. The memory device of claim 18, wherein the control circuitry comprises a control state machine.

20. The memory device of claim 18, wherein the control circuitry comprises a control circuit.

* * * * *